United States Patent
Stoneham et al.

(10) Patent No.: US 9,346,681 B2
(45) Date of Patent: May 24, 2016

(54) METHOD FOR SYNTHESISING DIAMOND

(75) Inventors: A. Marshall Stoneham, Dorchester-on-Thames (GB); Doreen Stoneham, legal representative, Dorchester-on-Thames (GB); Philip H. Taylor, Henley-on-Thames (GB)

(73) Assignee: DESIGNED MATERIALS LIMITED, Leicestershire (GB)

(*) Notice: Subject to any disclaimer, the term of this patent is extended or adjusted under 35 U.S.C. 154(b) by 748 days.

(21) Appl. No.: 13/634,511

(22) PCT Filed: Mar. 16, 2011

(86) PCT No.: PCT/GB2011/000369
§ 371 (c)(1),
(2), (4) Date: Feb. 28, 2013

(87) PCT Pub. No.: WO2011/114102
PCT Pub. Date: Sep. 22, 2011

(65) Prior Publication Data
US 2013/0217564 A1    Aug. 22, 2013

(30) Foreign Application Priority Data

Mar. 16, 2010  (GB) .................................. 1004373.5
Apr. 23, 2010  (GB) .................................. 1006860.9

(51) Int. Cl.
*C01B 31/06* (2006.01)
*C30B 9/00* (2006.01)
*C30B 19/02* (2006.01)
*C30B 19/06* (2006.01)

(52) U.S. Cl.
CPC . *C01B 31/06* (2013.01); *C30B 9/00* (2013.01); *C30B 19/02* (2013.01); *C30B 19/062* (2013.01)

(58) Field of Classification Search
None
See application file for complete search history.

(56) References Cited

U.S. PATENT DOCUMENTS

| 3,142,539 A | 7/1964 | Brinkman et al. |
| 7,547,358 B1 * | 6/2009 | Shapiro ........................... 117/68 |
| 2009/0257942 A1 | 10/2009 | Sung |

FOREIGN PATENT DOCUMENTS

GB    2471907 B    11/2011

OTHER PUBLICATIONS

Chen et al. "Metastable Growth of Diamond in Molten Alloy". Proceedings of the Sixth Applied Diamond Conference, pp. 305-316. 2001.

(Continued)

*Primary Examiner* — Guinever S Gregorio
(74) *Attorney, Agent, or Firm* — Lando & Anastasi, LLP

(57) ABSTRACT

A method of synthesizing diamond, the method comprising; (i) providing, in the presence of an atomic hydrogen plasma and/or in the presence of atomic hydrogen radicals, in a dissolution zone a liquid metal saturated with carbon with respect to graphite precipitation; (ii) transferring at least a portion of the liquid metal from the dissolution zone to a deposition zone, (vi) exposing the liquid metal in the deposition zone to atomic hydrogen plasma and/or to atomic hydrogen radicals, the temperature of the liquid metal in the deposition zone being lower than the temperature of the liquid metal in the dissolution zone such that the liquid metal in the deposition zone is saturated, preferably supersaturated, with carbon with respect to diamond precipitation; (vii) precipitating carbon from the liquid metal in the deposition zone to synthesize diamond; and (viii) optionally removing the synthesized diamond from the metal.

17 Claims, 3 Drawing Sheets

(56) References Cited

OTHER PUBLICATIONS

Figure 1:
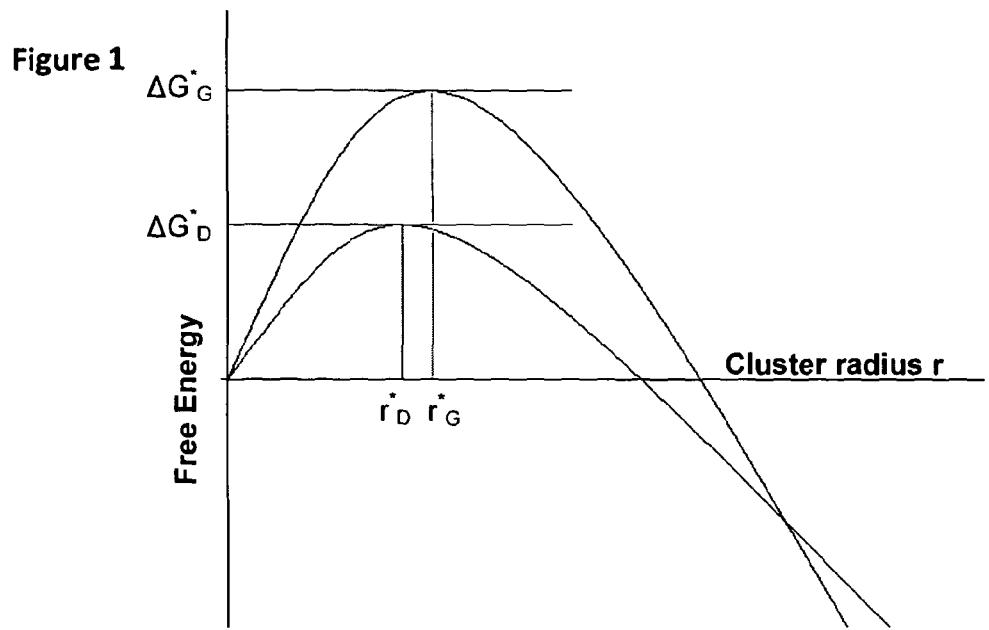

Roy et al. "New Process for Diamond Synthesis at Low Pressures is a Potential Route to the Growth of Large Single Crystal Diamond". Materials Technology vol. 11. 2006. pp. 6-9.

Roy et al. "Precipitation of Diamond from MexCyHz Solutions at 1 ATM". Materials Research Innovation, vol. 1, No. 2. Jan. 1, 1997. pp. 117-129.

Sung et al. Growth of Metastable Diamond in Liquid Phase: A Proposed Mechanism and Its Implications. High Temperatures-High Pressures, 27/28, pp. 611-628. 1995/96.

* cited by examiner

METHOD FOR SYNTHESISING DIAMOND

CROSS-REFERENCE TO RELATED APPLICATIONS

This application is a U.S. national phase application under 35 U.S.C. §371 of International (PCT) Patent Application Ser. No. PCT/GB2011/000369 filed Mar. 16, 2011, which in turn claims the benefit of priority to Great Britain Patent Application Ser. No. 1004373.5 filed Mar. 16, 2010, and Great Britain Patent Applicant Ser. No. 1006860.9 filed Apr. 23, 2010.

The present invention relates to a method of and apparatus for synthesising diamond.

In particular, the invention preferably relates to a process for the continuous production of diamond from a fluid saturated, preferably supersaturated with dissolved carbon. Uniquely, both the dissolution of the carbon source and the growth of diamond are performed in the presence of atomic hydrogen plasma and/or atomic hydrogen radicals. These steps are performed in two distinct areas of the apparatus, allowing precise control of conditions of synthesis of the diamond to achieve a wide range of end product shapes and forms.

U.S. Pat. No. 3,142,539 describes the growth of diamond from a supersaturated carbon-containing liquid metal in a vertical loop structure. Graphite is dissolved in a hot liquid metal solvent at the base of the loop, forming a saturated (with respect to graphite) carbon-metal melt. The fluid then moves around to the top of the loop via convection, where it is cooled so that it is supersaturated with carbon with respect to diamond. A seed diamond is then held in the cool part of the loop and is observed to grow, albeit slowly. The apparatus is a closed metal structure, and therefore is very expensive to build, maintain, and run. The internal atmosphere, where present, is inert (i.e. argon). The method described in U.S. Pat. No. 3,142,539 is an expensive way to get very small growth rates of diamond and uses apparatus that is difficult to service. The actual diamond mass formed is also not always good quality because of the inability of the system to control nucleation of graphite alongside the diamond in the growth area, leading to the production of a polycrystalline mass of diamond and graphite rather than pure diamond.

U.S. Pat. No. 6,342,195 describes a method of making diamond comprising mixing together at least one non-vapour phase carbon source material and at least one material comprising at least one metal. The metal or alloy comprises at least one element from the transition metal series, or a lanthanide group metal. The sizes of the crystals formed are very small due to the low growth rate kinetics that dominate once the initial carbon supersaturation conditions have subsided. This is because the system does not continuously replenish the carbon coming out of solution. This therefore places practical limits the on size of end product that can be produced.

U.S. Pat. No. 7,547,358 describes a system to synthesise diamond in a closed loop structure similar in nature to that described by Brinkman in U.S. Pat. No. 3,142,539. The system described preferably uses highly reactive alkali group metals in liquid form (either as the elemental form or as a hydride) as the solvent medium. This system uses an electromagnetic or physical pump to aid the flow of solvent around the loop and describes several methods for the removal of the grown crystals at the end of the experiment. The invention is primarily a low temperature system but mentions the use of indium, gallium, and lead based growth.

The use of highly reactive alkali metals in U.S. Pat. No. 7,547,358 is potentially dangerous. The system described in U.S. Pat. No. 7,547,358, for example, would explode catastrophically if any oxygen or water vapour came into contact with the system contents. The safety features and processes required to maintain this system would be very expensive, impacting the economics of the process. It would therefore be desirable to provide a safer, more economical process for synthesising diamonds.

The method of U.S. Pat. No. 7,547,358 is designed to operate at moderate temperatures (sub 800° C.). The current prior art suggests that this will severely limit the growth rates of the diamonds (if any) that are produced.

U.S. Pat. No. 5,404,835 discloses a CVD (chemical vapour deposition) process where diamond is grown on a liquid nickel hydride film in a CVD reactor. Diamond crystals form on the liquid metal/metal hydride surface, which orientate themselves on the meniscus according to their lowest free energy state (determined here by the interfacial energy). Further CVD growth occurs on the crystals until they meet, and therefore the film formed has largely oriented crystalline planes.

U.S. Pat. No. 4,485,080 refers to a process to manufacture fine diamond grit using a rapid quench technique from a liquid metal alloy melt supersaturated with dissolved carbon. The technique relies on first supersaturating the metal alloy with carbon at a high temperature, and then rapidly quenching this mixture using a spray technique commonly used in powder metallurgy. It is expected that the interfacial energy effects of the solvent medium and the large change in chemical potential caused by the rapid quench tend to favour the production of microscopic diamond nuclei rather than graphitic nuclei. These are then slowly grown in a solid state solution by the application of heat to the solid material for long periods of time.

The present invention aims to address at least some of the disadvantages of the prior art methods.

It is one object of the present invention to provide an improved method and apparatus for synthesising diamond. Preferably, the method enables diamonds to be synthesised in a continuous process.

In the first aspect of the present invention there is provided a method of synthesising diamond, the method comprising;
  (i) providing, in the presence of an atomic hydrogen plasma and/or in the presence of atomic hydrogen radicals, in a dissolution zone a liquid metal saturated with carbon with respect to graphite precipitation;
  (ii) transferring at least a portion of the liquid metal from the dissolution zone to a deposition zone;
  (iii) exposing the liquid metal in the deposition zone to atomic hydrogen plasma and/or to atomic hydrogen radicals, the temperature of the liquid metal in the deposition zone being lower than the temperature of the liquid metal in the dissolution zone such that the liquid metal in the deposition zone is saturated, preferably supersaturated, with carbon with respect to diamond precipitation;
  (iv) precipitating carbon from the liquid metal in the deposition zone to synthesise diamond; and
  (v) optionally removing the synthesised diamond from the metal.

In the second aspect of the present invention there is provided an apparatus for synthesising diamond, the apparatus comprising:
  a dissolution zone for dissolving carbon in a liquid metal, the dissolution zone comprising a means for applying atomic hydrogen plasma and/or atomic hydrogen radicals to the liquid metal in said zone;

a deposition zone for precipitating diamond from the liquid metal, the deposition zone comprising a means for applying atomic hydrogen plasma and/or atomic hydrogen radicals to the liquid metal in said zone;

wherein the dissolution zone and the deposition zone are in fluid communication with one another;

a means of pumping and/or moving liquid metal from the dissolution zone to the deposition zone;

a heating means for independently heating liquid metal present in the dissolution zone and the deposition zone;

optionally a means for removing the diamond formed from the apparatus; and a means of controlling the atmosphere in the apparatus.

Each aspect as defined herein may be combined with any other aspect or aspects unless clearly indicated to the contrary. In particular, any feature indicated as being preferred or advantageous may be combined with any other feature or features indicated as being preferred or advantageous.

The present invention provides an improved method of synthesising diamonds, and a method in which isotopically pure carbon sources may be used to synthesise isotopically pure diamonds with enhanced properties, for example, greater thermal conductivities and/or mechanical strength.

The present method and apparatus is economically viable to run, and is cheaper than known methods of synthesising diamonds.

The present invention also provides a method of doping diamonds.

Using the process described herein it is possible to grow a large range of diamond substrates either homoepitaxially (i.e. on a seed crystal), or heteroepitaxially (i.e. on a non-diamond liquid or solid surface), and control the rate of deposition precisely.

As used herein the term hydrogen preferably includes isotopes of hydrogen, for example $^1H$ (protium), $^2H$ (deuterium) and $^3H$ (tritium). Other isotopes of hydrogen may also be used. Preferably, the term hydrogen refers to $^1H$ (protium).

As used herein the term liquid metal includes liquid, semi-liquid and/or molten metal. It also includes mixtures of more than one metal. It also includes alloys, and mixtures of more than one alloy and/or metal.

The metal used in the present invention may comprise a single metallic element, or an alloy, or two or more metallic elements and/or alloys. Preferably, the metal is selected from lead, bismuth, tin, gold, silver, copper, palladium, indium, gallium, antimony, nickel, cobalt, iron, aluminium, germanium and mixtures of two or more thereof. More preferably, the metal comprises silver, gold, copper, palladium, indium, gallium, tin, aluminium, lead or mixtures of two or more thereof. In one embodiment the metal is indium, silver, gold or lead or an alloy containing indium, silver, gold, or lead. Suitable alloys include lead-gold, silver-gold, lead-tin, and indium-lead alloys. Most preferably the metal is indium, silver, gold, copper, palladium, or lead or an alloy containing indium, silver, gold, copper, palladium, or lead. Suitable alloys include lead-gold, silver-gold, lead-tin, and indium-lead alloys. Immiscible metal mixtures may be used such as lead-iron or aluminium-lead.

Preferably, the liquid metal does not comprise an alkali metal. In particular, it is preferred that the liquid metal does not comprise an alkali metal hydride. Such materials are potentially dangerous if exposed to oxygen and/or air.

Preferably the source of carbon in the metal is graphite. Typically the source of carbon will be a solid carbon source. However, it will be understood that any other suitable source of carbonaceous material may be used. Preferably the carbonaceous material is largely graphitic in nature, for example vitreous carbon, compressed graphite, or carbon nanotubes. An isotopically pure source of carbon may be used to grow isotopically pure diamonds with enhanced properties, such as enhanced thermal conductivity and/or improved mechanical strength.

The carbon source material may be graphite of any density or porosity available commercially, or other form of carbon consisting of mostly $sp^2$ bonded carbon atoms. When graphite is used, preferably it has a purity of greater than 99% carbon (in terms of the number of atoms of carbon as a proportion of the total number of atoms), more preferably at least 99.99% carbon. The purity of the graphite used can be as low as 70% however if the only other significant impurity is hydrogen, but preferably the combination of the two atomic proportions of carbon and hydrogen in the graphitic material is over 99.99% in comparison to other impurities present. In processes where the production of a diamond material with specific isotopic proportions is desired, the graphitic source can be constructed from corresponding proportions of carbon-12, carbon-13, or carbon-14 as required.

Preferably the source of carbon is immersed in the metal by a plunger. The plunger may be used to hold the source of carbon underneath the meniscus of the liquid metal whilst the carbon dissolves.

The depth to which the carbon source material is submerged under the meniscus of the liquid metal is preferably kept as low as possible. Preferably this depth is less than 50 mm, more preferably less than 10 mm, and most preferably less than 2 mm from the meniscus of the liquid metal to the top of the carbon source. This allows diffusion of hydrogen species generated by the atomic hydrogen radical source and/or plasma generating source onto the surface of the carbon source material. This ensures that the concentration of carbon in the solvent medium is pushed to a much higher value than the reported equilibrium value determined by standard binary phase diagrams. Without wishing to be bound by any particular theory, this is thought to be due to the formation of solvent-carbon-hydrogen species within the fluid solvent which display far higher equilibrium concentrations than the simple solvent-carbon binary systems.

The metal preferably has a boiling point of greater than 1500° C., 1750° C., or greater than 2000° C.

The metal preferably has a melting point of below 1500° C., more preferably below 1450° C., below 1000° C. or below 500° C.

Preferably, in order to provide a liquid metal saturated with carbon with respect to graphite precipitation the metal is heated to a temperature greater than 1000° C. and preferably in the range of from 1000 to 2500° C., more preferably the liquid metal is heated to a temperature in the range of from 1000 to 2000° C., from 1500 to 1750° C., from 1550 to 1750° C., or from 1550 to 1650° C. As outlined above, preferably the carbon source is dissolved in the liquid metal in the presence of atomic hydrogen and/or atomic hydrogen plasma in order to form a high concentration of carbon in the metal.

Preferably, in the deposition zone, the temperature of the liquid metal saturated with carbon with respect to graphite precipitation is lowered for example, by from 5 to 250° C., from 5 to 200° C., from 5 to 150° C., from 50 to 100° C. or from 100 to 200° C. such that the liquid metal is saturated with carbon with respect to diamond precipitation at the coolest part of the liquid metal. More preferably, the temperature is lowered from 50 to 200° C., more preferably still it is lowered from 125 to 175° C. such that the liquid metal is saturated with carbon with respect to diamond precipitation at the coolest part of the liquid metal. Preferably, the temperature of the liquid metal in the deposition zone is lowered such that the liquid metal is supersaturated with carbon with respect to diamond precipitation in the coolest part of the liquid metal. The deposition zone is also exposed to atomic hydrogen plasma and/or atomic hydrogen radicals.

Unless otherwise specified, the temperature and/or saturation levels of the liquid metal are measured at the coolest part of the metal.

In the deposition zone, the temperature of the liquid metal is lowered so that the liquid metal becomes saturated, and preferably supersaturated, with carbon with respect to diamond precipitation. This allows carbon in the metal to precipitate out, synthesising diamond. Because of a combination of interfacial energy effects, diamond may precipitates out of the solution alongside graphite. However, the atomic hydrogen plasma and/or atomic hydrogen radicals preferentially destroy any co-precipitating graphitic nuclei and the system therefore preferably only produces diamonds.

The present invention makes use of the liquid metal forming a lower energy interface with diamond surfaces than it does with graphitic surfaces. In the deposition zone carbon precipitates (or comes out) of the saturated or supersaturated liquid metal as diamond. This is thought to be due to both the interfacial energy effects of the fluid and the preferential etching and/or destruction of any graphitic nuclei by the hydrogen plasma and/or atomic hydrogen radicals.

In one embodiment a seed diamond is at least partially immersed in the liquid metal in the deposition zone such that the carbon is precipitated onto the seed diamond. This results in the growth of this seed diamond into a larger diamond.

The depth to which the seed crystal is submerged under the meniscus of the liquid metal is preferably low. Preferably this depth is less than 50 mm, more preferably less than 10 mm, and most preferably less than 2 mm below the meniscus to the top of the seed diamond. This allows diffusion of the atomic hydrogen species which are preferably generated by an atomic hydrogen source and/or a plasma producing unit into the solvent medium surrounding the diamond. This background concentration of atomic hydrogen preferentially degrades any graphitic nuclei which may precipitate out alongside diamond in the heavily supersaturated environment of the deposition area. This in turn encourages carbon dissolved in the solvent medium to precipitate out as diamond onto the seed diamond surface, thus increasing its mass. In embodiments of the invention that grow diamond onto a seed diamond crystal, the diamond generally is not immersed into the solvent medium until the dissolution process has been running for several minutes and the melt is therefore fully supersaturated with dissolved solvent-carbon-hydrogen species. This is done to prevent dissolution of the diamond seed in the solvent, which can occur rapidly if the solvent is not supersaturated with carbon with respect to diamond.

In another embodiment, the concentration of reactive atomic hydrogen species and/or the intensity of the hydrogen plasma and/or of the atomic hydrogen radicals is altered and/or the temperature of the liquid metal in the deposition zone is controlled so that diamond nucleates out of the liquid metal, negating the need for the use of a seed diamond. Diamond formed in this way may, for example, be grown into a film, typically a thin film (of thickness about 50 μm) or it may be retrieved and used, for example, as abrasive grit material.

In another embodiment, a layer of immiscible liquid metal with a lower density than diamond is present in the deposition zone above a denser solvent layer. Diamond may be grown on a seed crystal held at the interface of the two liquids, or nucleated at the interface between the two liquids to form a flat film structure (i.e. float diamond). In this embodiment any seed diamond used is preferably not immersed into the deposition zone until both solvent layers are supersaturated with carbon.

High temperature refractory ceramics may also be included in the liquid metal. Suitable examples of high temperature refractory ceramics for use in the present invention include boron nitride, alumina, zirconia, magnesia, aluminium nitride, titanium diboride or other refractory ceramics, either as a bulk material or as a coating on another refractory material. Such ceramics allow for the reliable operation of the method at temperatures above 1000° C.

Preferably the method of the present invention is carried out at an ambient pressure in the range of from 10 Pa to 150 kPa, from 50 Pa to 125 kPa, more preferably from 100 Pa to 100 kPa. Preferably the pressure is below 100 kPa.

It will be understood that the relevant phase diagram data, or the appropriate thermodynamic approximations where phase diagram data is not available, may be used to calculate when the metal is saturated/supersaturated with carbon with respect to graphite and then when it is saturated/supersaturated with carbon with respect to diamond.

The dissolution zone may be comprised of any suitable vessel and/or chamber. Preferably, as used herein the term "dissolution zone" is used to describe the area or zone in which one or more liquid metal(s) may be saturated with carbon with respect to graphite precipitation.

The deposition zone may be comprised of any suitable vessel and/or chamber. Preferably, as used herein the term "deposition zone" is used to describe the area or zone in which one or more liquid metal(s) may be saturated, preferably supersaturated, with carbon with respect to diamond precipitation such that carbon may precipitate from the liquid metal.

Preferably, the dissolution zone and the deposition zone are distinct zones in fluid communication with one another.

Preferably, the dissolution zone and the deposition zone are in fluid communication with one another by means of a continuous loop. Preferably liquid metal may be pumped from the dissolution zone to the deposition zone and then subsequently from the deposition zone back to the dissolution zone by means of the loop. This allows the liquid metal to be recirculated around the system.

In one embodiment there is a continuous flow of the liquid metal from the dissolution zone to the deposition zone. This is advantageous as it permits the carbon present in the liquid metal in the deposition zone to be continuously replenished. This allows larger diamonds to be formed than would be possible if the carbon present in the liquid metal in the deposition zone was not replenished, as is the case in many prior art methods.

In one embodiment the dissolution zone and the deposition zone are in fluid communication with one another by means other than a continuous loop. Liquid metal may be continuously fed into the dissolution zone, transferred from the dissolution zone to the deposition zone, and then discarded. This embodiment permits the amount of carbon present in the liquid metal in the deposition zone to be continuously replenished.

Preferably the method of the present invention is performed with the continuous loop in a substantially horizontal configuration. Preferably, the method of the present invention is performed with the continuous loop in a horizontal configuration. It will be understood that the method of the present invention may be performed when the loop (otherwise named the trackway) is inclined at an angle of from 0 to 45° to horizontal. Preferably, it will be inclined at an angle of from 0 to 20° to horizontal, from 0 to 10°, or from 0 to 5° to horizontal.

Preferably the loop, the dissolution zone and the deposition zone are all positioned in a substantially horizontal configuration. Alternatively, only the loop (or trackway) may be positioned in a substantially horizontal configuration, or the dissolution zone and the deposition zone may be positioned in a substantially horizontal configuration.

Preferably, the loop or trackway is an open-sided vessel. Having an open-sided vessel as the loop or trackway is advantageous over closed-vessels or tubes as open-sided vessels are more economical to maintain and run.

At least a portion of the liquid metal may be transferred from the dissolution zone to the deposition zone by pumping. An electromagnetic and/or a mechanical pump may be used to control the flow of liquid metal from one zone to the next.

Suitable electromagnetic pumps for use in the present invention (and variations on the same theme such as magnetohydrodynamic pumps or eddy current pumps) used to move the metallic solvent around a system are described in U.S. Pat. No. 3,038,409. The use of pumps with no moving parts to move liquid metals about is well known. Current is applied laterally across the channel using two electrodes, and a magnetic field applied using a coil wrapped around a former set vertically to the channel. This creates a net flow along the channel as described in physics by Fleming's left hand rule—basically this states that a wire held perpendicular to a magnetic field will generate force if a current flows through it. This technique is used widely in sodium cooled nuclear reactor coolant systems, and in aluminium scrap refining systems as the pump has no moving parts to wear out and thus sealed systems like this can run for years without maintenance. It will be understood that a physical pump (i.e. a paddlewheel) may also be used in the present process instead of an electromagnetic (EM) pump.

Preferably the flow rate of the liquid metal in process is from 1 ml per minute to 100 liters per minute. More preferably the flow rate is 10 ml per minute to 1 liter per minute. Most preferably the flow rate is 50 ml to 100 ml per minute.

Preferably the flow rate of the liquid metal into the deposition zone is selected such that the rate of loss of carbon atoms from the liquid metal in the deposition zone by precipitation of diamond is less than the rate of replacement of carbon atoms in the liquid metal in the deposition zone by flowing more liquid metal from the dissolution zone into the deposition zone.

The method of the present invention includes providing, in the presence of an atomic hydrogen plasma and/or atomic hydrogen radicals, in a dissolution zone a liquid metal saturated with carbon with respect to graphite precipitation. Advantageously, the presence of the atomic hydrogen plasma and/or atomic hydrogen radicals (compared to their absence) increases the carbon solubility in the liquid metal during solvation.

Preferably the atomic hydrogen plasma and/or atomic hydrogen radicals is generated by a microwave, hot filament, arc jet, DC plasma glow or a flame method. Such methods are known in the art. Any other suitable methods of providing atomic hydrogen may be used. Preferably, a source of atomic hydrogen radicals is held over the liquid metal in the dissolution zone. In one embodiment the source used in the present invention comprises only hydrogen atoms and no other atoms. In an another embodiment the source of atomic hydrogen may comprise mixtures of hydrogen atoms and other atoms, for example argon atoms.

The method of the present invention includes exposing the liquid metal in the deposition zone to atomic hydrogen plasma and/or atomic hydrogen radicals. The presence of the atomic hydrogen plasma and/or atomic hydrogen radicals reduces the likelihood of carbon nucleating out as graphite, rather than diamond. Preferably, the presence of the atomic hydrogen plasma and/or atomic hydrogen radicals ensures that little or substantially no carbon precipitates out as graphite, rather than diamond. If atomic hydrogen plasma and/or atomic hydrogen radicals were not present in the deposition zone, it would be expected that some graphite would nucleate out alongside diamond, although diamond would be energetically preferred in many cases. If hydrogen plasma and/or atomic hydrogen radicals are present, these growing nuclei are rapidly etched away and the quality of the diamond produced is therefore preserved. Thus, the yield of diamond over graphite produced using the method of the present invention is therefore dramatically increased over methods which do not use atomic hydrogen plasma and/or atomic hydrogen radicals in the deposition zone.

Preferably the flow rate of hydrogen gas to the atomic hydrogen plasma and/or atomic hydrogen radical producing unit is from 0.1 sccm to 10 slpm. More preferably, the flow rate of hydrogen gas to the atomic hydrogen plasma and/or atomic hydrogen radical producing unit is from 1 sccm to 1 slpm. Most preferably, the flow rate of hydrogen gas to the atomic hydrogen plasma and/or atomic hydrogen radical producing unit is from 10 sccm to 500 sccm.

Preferably, the method of the present invention further comprises applying an electrical bias across the liquid metal in the deposition zone and/or dissolution zone. The electrical bias may be induced in the dissolution zone. This is done to aid the dissolution of the carbon source material into the liquid metal. High concentrations of atomic hydrogen in a liquid metal can push the solubility of carbon to extreme values (as much as 50 At % in the case of the Au—C—H). An electrical bias may also be used to the same effect in the diamond deposition area. An electrical bias is applied to the deposition zone to attract charged hydrogen species into the solvent in order to break down graphitic clusters which may have nucleated alongside diamond. The presence of the electrical bias in the dissolution and/or deposition zones enhance the diffusion of the hydrogen radicals (preferably from a plasma) into the liquid metal by raising the concentration of reactive hydrogen species at the metal surface, increasing the concentration of carbon in the solvent (metal). Without wishing to be bound by any particular theory, this is thought to be driven by charged hydrogen species both on and below the liquid surface undergoing charge transfer processes to form atomic hydrogen radicals and metal-carbon-hydrogen species. The applied bias and/or frequency of the electric field may be adjusted in order to control the nucleation and/or growth rate of diamond.

Preferably a voltage in the range of from 0.1 volts to 1000V will be applied. The applied voltage bias may be standard direct current (DC), pulsed DC, or an alternating current. If the DC voltage bias is pulsed preferably the frequency of the pulsed electric field applied will be from 0 Hz to 100 kHz, or from 1 Hz to 100 Hz. If an alternating current is applied, preferably the frequency will be from 1 Hz to 100 kHz.

In one embodiment of the present invention the method may be used to synthesise diamonds comprising a dopant (doped diamonds). Doped diamonds may be synthesised or grown by including one or more dopants in the liquid metal. The dopant may be selected from boron, phosphorus, sulphur, lithium, aluminium and mixtures of two or more thereof.

In another embodiment of the invention, doped diamond may be grown by the addition of a gaseous precursor to the hydrogen plasma and/or atomic hydrogen radical generating source. Examples of such a gas include, but are not limited to, nitrogen, borane, hydrogen sulphide, or phosphine in order to dope the growing diamond crystal with nitrogen, boron, sulphur, or phosphorus atoms respectively.

Preferably, the method of the present invention allows the continuous production of one or more diamonds from carbon dissolved in a continuous flowing liquid metal source.

Preferably the method of the present invention is carried out in a reaction chamber comprising an inert gas. Preferably the inert gas comprises a noble gas. The inert gas may comprise mixtures of two or more noble gases. Preferably the inert gas comprises helium and/or argon. Most preferably the inert atmosphere comprises argon.

Preferably the inert gas comprises at least 90% by volume of noble gas based on the total volume of gas in the reaction chamber. More preferably, the inert gas comprises at least 95%, at least 98%, at least 99%, at least 99.9% by volume of noble gas based on the total volume of gas in the reaction chamber. Most preferably the noble gas is argon.

Preferably the internal atmosphere of the reaction chamber does not comprise oxygen. The presence of oxygen in the atmosphere is thought to speed up the rate of graphitisation of the diamond. The atmosphere in the reaction chamber preferably comprises less than 0.1% by volume of oxygen based on the total volume of gas in the reaction chamber. More preferably, the atmosphere comprises less than 0.05%, 0.01%, 0.001% or 0.0001% by volume of oxygen based on the total volume of gas in the reaction chamber.

As outlined above, the second aspect of the present invention provides an apparatus for synthesising diamond, the apparatus comprising:
- a dissolution zone for dissolving carbon in a liquid metal, the dissolution zone comprising a means for applying atomic hydrogen plasma and/or atomic hydrogen radicals to the liquid metal in said zone;
- a deposition zone for precipitating diamond from the liquid metal, the deposition zone comprising a means for applying atomic hydrogen plasma and/or atomic hydrogen radicals to the liquid metal in said zone;
- wherein the dissolution zone and the deposition zone are in fluid communication with one another; a means of pumping and/or moving liquid metal from the dissolution zone to the deposition zone;
- a heating means for independently heating liquid metal present in the dissolution zone and the deposition zone;
- optionally a means for removing the diamond formed from the apparatus; and
- a means of controlling the atmosphere in the apparatus.

Preferably, the apparatus further comprises a means of applying an electrical bias across the liquid metal in the dissolution zone and/or the deposition zone. Preferably, the dissolution zone and the deposition zone are in fluid communication with each other by means of an open vessel. More preferably, the dissolution zone and the deposition zone are in fluid communication with each other by means of a continuous loop. In use, preferably, the continuous loop is substantially horizontal.

It has long been known that diamond can be both nucleated and grown out of a solvent medium that is supersaturated with carbon. Work originally performed in 1905 by Burton, Nature (1905) 397, and confirmed in 1985 by Sebba, N. Sugarman, Nature 316 (1985) 220-220, showed that diamond can be nucleated out of a lead based system driven rapidly to supersaturation with respect to diamond.

The current inventors have previously described a theoretical framework that may predict why diamond is produced in certain carbon supersaturated fluids in preference to graphite. This framework indicates that fluids forming lower energy interfaces with key diamond surfaces compared to key graphite surfaces will tend to favour the stability of the diamond surface at temperatures at which diamond would normally revert to graphite. This allows for the suppression of graphitisation at high temperatures on diamond surfaces that are immersed in such a fluid, allowing the diamond to be annealed or doped at otherwise destructive temperatures. The invention presented here exploits these effects alongside several novel advances in order to continuously grow diamond from a carbon (preferably graphitic) source.

Nucleation and Growth of Diamond at the Deposition Stage

In a carbon saturated fluid solvent, classical nucleation theory states that the total free energy of formation, $\Delta G$, for a given nucleus of either diamond or graphite can be expressed as:—

$$\Delta G_{BULK} = 4/3 \pi \rho r^3 \Delta \mu$$

$$\Delta G_{SURFACE} = 4\pi r^2 \sigma_{SL}$$

$$\Delta G_{TOTAL} = 4/3\pi\rho r^3 \Delta\mu + 4\pi r^2 \sigma_{SL} = \Delta G_{BULK} \times \Delta G_{SURFACE} \quad (1)$$

Where $\rho$ is the density of the solid phase, $\Delta\mu$ is the change in chemical potential during condensation into the solid phase, and $\sigma_{SL}$ the interfacial energy between the solid phase and fluid surround. From wetting data obtained by measuring the angle a fluid droplet forms on diamond and graphite surfaces, $\sigma_{SL}$ can be obtained from the wetting angle $\theta$, or the work of adhesion $W_a$ from the following equations:—

$$\sigma_{SL} = \sigma_{SV} - \cos\theta \sigma_{LV} \quad (2)$$

$$\sigma_{SL} = \sigma_{LV} + \sigma_{SV} - W_a \quad (3)$$

Furthermore, the change in chemical potential on solidification of the dissolved carbon, $\Delta\mu$, can be defined as a function of the degree of undercooling in the melt relative to the melting point of carbon:—

$$\Delta\mu = \frac{\Delta H_v \Delta T}{T_m} \quad (4)$$

Where $\Delta H_v$ is the enthalpy change in solidification, $\Delta T$ is the temperature change, and $T_m$ the melting point of the carbon allotrope (i.e. graphite or diamond). Using a negative value for $\Delta H_v$ gives a negative value for $\Delta\mu$. This then infers that the bulk energy term in equation (1) is negative whereas the surface energy term is positive. This two component nature of the overall free energy change of the nucleation process leads to a nucleation barrier for a critical cluster size $r^*$, meaning that once a nucleating cluster of diamond or graphite has reached a critical size, it will be energetically stable and carry on growing. The growth rate of such a cluster is then dominated by the kinetics and availability of free carbon within the system. The free energy change required to form a critical cluster of either diamond or graphite can then be calculated using:—

$$\Delta G^* \propto \frac{16\pi V_m^2 \sigma_{SL}^3}{3\Delta\mu^2} \quad (5)$$

where $V_m$ is the molar volume of the phase (i.e. 3.417 cm$^3$ mol$^{-1}$ for diamond and 5.298 cm$^3$ mol$^{-1}$ for graphite). Assuming a value for of 3.7 Jm$^{-2}$ as an arbitrary value for the $\sigma_{SV}$ of diamond, and 3.1 Jm$^{-2}$ for graphite (see D. V. Fedoseev, B. V. Deryagin, I. G. Varasayskaja, Surface & Coatings Technology 38 (1989) R7-248) and values of $\Delta\mu$ similar in proportion to those predicted theoretically (see V. Guencheva, E. Grantscharova, I. Gutzow, Crystal Research and Technology 36 (2001) 1411-1428) we can expect a nucleation profile similar to that shown in FIG. 1.

This indicates that within a solvent system displaying the outlined interfacial energy conditions it is possible to nucleate diamond alongside graphite if the degree of supersaturation of carbon is high enough. Without wishing to be bound by any particular theory, this is thought to be why diamond nucleation is seen in U.S. Pat. No. 3,142,539. Indeed, in earlier work, we have found that several of the solvent fluids detailed in U.S. Pat. No. 3,142,539 do indeed fulfil such interfacial energy criteria. This observation can also explain how further deposition growth occurs on diamond surfaces that are immersed in such a fluid as reported frequently in the literature. In short it seems that in highly supersaturated solvents displaying such interfacial energy differences between diamond and graphite, the surface energy changes dominate the thermodynamics, and small bulk energy preference for graphite is largely overridden and diamond is therefore produced. It is also known that the presence of both charged and radical species can have a role in stabilising growing diamond surfaces with respect to graphite, and this may also play a role in optimising diamond growth in the invention described here.

The current invention takes advantages of the fact that the presence of atomic hydrogen radicals can push the limit of solubility of carbon in some fluids far beyond the equilibrium values indicated by binary phase diagram data, thus a solvent may be produced which is very highly supersaturated with dissolved carbon and other carbon-hydrogen-solvent species.

Controlling the Rate of Deposition of Diamond

The current state of the art for the deposition of diamond at low to ambient pressures is typified by CVD growth techniques that use a hydrocarbon gas as the carbon source. These techniques have been refined to such an extent that it is possible to grow high quality diamond films at rates approaching 1 mm per hour when performed at high enough temperatures. The rate limiting factor then becomes the availability of atomic carbon or radical hydrocarbon species in the growth medium. In most practical examples of CVD diamond deposition, the gaseous environment provides a relatively low concentration of carbon atoms at the growth surface.

The current invention recognises this rate limiting step during diamond growth, and removes it by providing a relatively high concentration of free carbon atoms or carbon radicals at the growth surface. This allows for higher rates of diamond growth that can be calculated and fine tuned in a manner described below.

Assuming a constant flow rate of the solvent in the system (trackway) driven by the pump, an equation can be derived to estimate the amount of carbon forced out of solution in the deposition zone per unit time. This is:

$$\frac{\partial M}{\partial t} = \frac{\Delta At_C \cdot f \cdot MW_C \cdot \rho_M}{100 \rho_\diamond MW_M} \quad (6)$$

in mm$^3$ sec$^{-1}$ where f is the solvent flow rate in mm$^3$ sec$^{-1}$, $\Delta At_C$ is the change in the equilibrium concentration of carbon in the melt expected over the cooling range (in At %), $MW_M$ is the molecular weight of the solvent medium and $\rho_M$ its density. Since the two terms $\rho_\diamond$ (the density of diamond) and $MW_C$ (the molecular weight of carbon) can be assumed to be constant for a system using an isotopically "average" carbon source, we can rewrite this as:

$$\frac{\partial M}{\partial t} = \frac{0.0342185 \cdot \Delta At_C \cdot f \cdot \rho_M}{MW_M} \quad (7)$$

Using binary phase data from M. Hansen, Constitution of Binary Alloys, McGraw-Hill, New York (1958) for a solvent medium such as Pb, we can estimate that a dissolution zone temperature of 1600° C. and a deposition zone temperature of 1250° C. at a flow rate of 1 mm$^3$ sec$^{-1}$ should result in the deposition of 9 mm$^3$ (or 31.71 mg) of diamond per hour. This figure does not however take into account the increased carbon solubility in a solvent medium that has been heated in the presence of atomic hydrogen radicals generated by microwave, DC arc-jet, DC plasma glow, hot filament, or other means. Experiments with such solvents show that the change in value of $\Delta At_C$ is therefore generally much larger for a given temperature range than the equilibrium values indicated in binary phase diagrams. This is exploited in this invention to thermodynamically drive nucleation and deposition of diamond in the deposition zone.

Furthermore, systems based on deposition where an atomic hydrogen plasma and/or atomic hydrogen radicals are not present will inevitably nucleate out graphitic particles alongside diamond, which reduces the yield of diamond commensurately. This deleterious effect on diamond yields can be expressed in mathematical form by splitting the $\delta M$ term into two separate terms, namely $\delta M_D$ (the mass of diamond precipitated) and $\delta M_G$ (the mass of graphitic/sp2 bonded carbon precipitated). The resulting formula expresses the relative amounts of carbon produced as:

$$\frac{\partial M_D}{\partial t} + \frac{\partial M_G}{\partial t} = \frac{0.0342185 \cdot \Delta At_C \cdot f \cdot \rho_M}{MW_M} \quad (8)$$

Since this equation represents a measure of efficiency of the process (i.e. the ratio of diamond produced relative to that of graphitic carbons), we can simplify this description of the process to a simple formula such as:—

Mass of diamond deposited/sec=Mass of carbon precipitating out over temperature drop−Mass of graphitic carbon deposited/sec Or:

$$\frac{\partial M_D}{\partial t} = \frac{0.0342185 \cdot \Delta At_C \cdot f \cdot \rho_M}{MW_M} - \frac{\partial M_G}{\partial t} \quad (9)$$

The invention here uses the novel step of using an atomic hydrogen plasma and/or a source of atomic hydrogen radicals in the deposition zone of the continuous flow system in order to retard the nucleation and growth of graphite and therefore keep the $\delta M_G$ term to a minimum. Repressing the formation of graphite in such a manner is well understood and well defined in the literature, but has not been exploited in a continuously flowing growth system before now.

To optimise the efficiency of the deposition process of the present invention five process variables may be controlled. These are:
1. The concentration and intensity of the atomic hydrogen plasmas and/or atomic hydrogen radicals over both the dissolution zone and deposition zones.
2. The temperature difference between the dissolution and deposition zones.
3. The flow rate of the solvent medium through the system.
4. The ambient physical and chemical environment.
5. In some embodiments of the invention, a voltage bias across the solvent medium and or/seed diamond crystal is used to control dissolution and deposition rates.

These process variables are therefore controlled in the apparatus described in a manner familiar to any skilled practitioner of the art. These include, but are not limited to, control of the flow rate of hydrogen gas to the plasma and/or atomic hydrogen radical producing equipment in the apparatus (be it a magnetron, arc-jet, DC glow, hot filament, photonic based system, or otherwise), control of electrical power levels or frequency to such plasma and/or atomic hydrogen radical producing equipment, control of electrical power level or frequency to other integral heating elements (either by resistive or inductive methods or otherwise), control of electrical power level or frequency to the electromagnetic pump in the system or control of speed of any mechanical pump in the system to regulate solvent flow around the system, control of chemical conditions inside the process chamber (including but not limited to the control of the admission of gases other than hydrogen into the process environment), control of the rate of heating or cooling of various parts of the process equipment (either by active or passive methods), and control of electrical bias to parts of the system in order to enhance rates of dissolution or nucleation or growth.

The present invention will now be described further, by way of example only, with reference to the following drawings, in which:

FIG. 1: Classical nucleation theory (CNT) interpretation of the nucleation barrier for a critical spherical cluster of diamond or graphite nucleating in a carbon supersaturated fluid obeying the interfacial energy criterion outlined. The y axis on the graph refers to Free Energy. The x-axis refers to cluster radius r.

Figure 2:
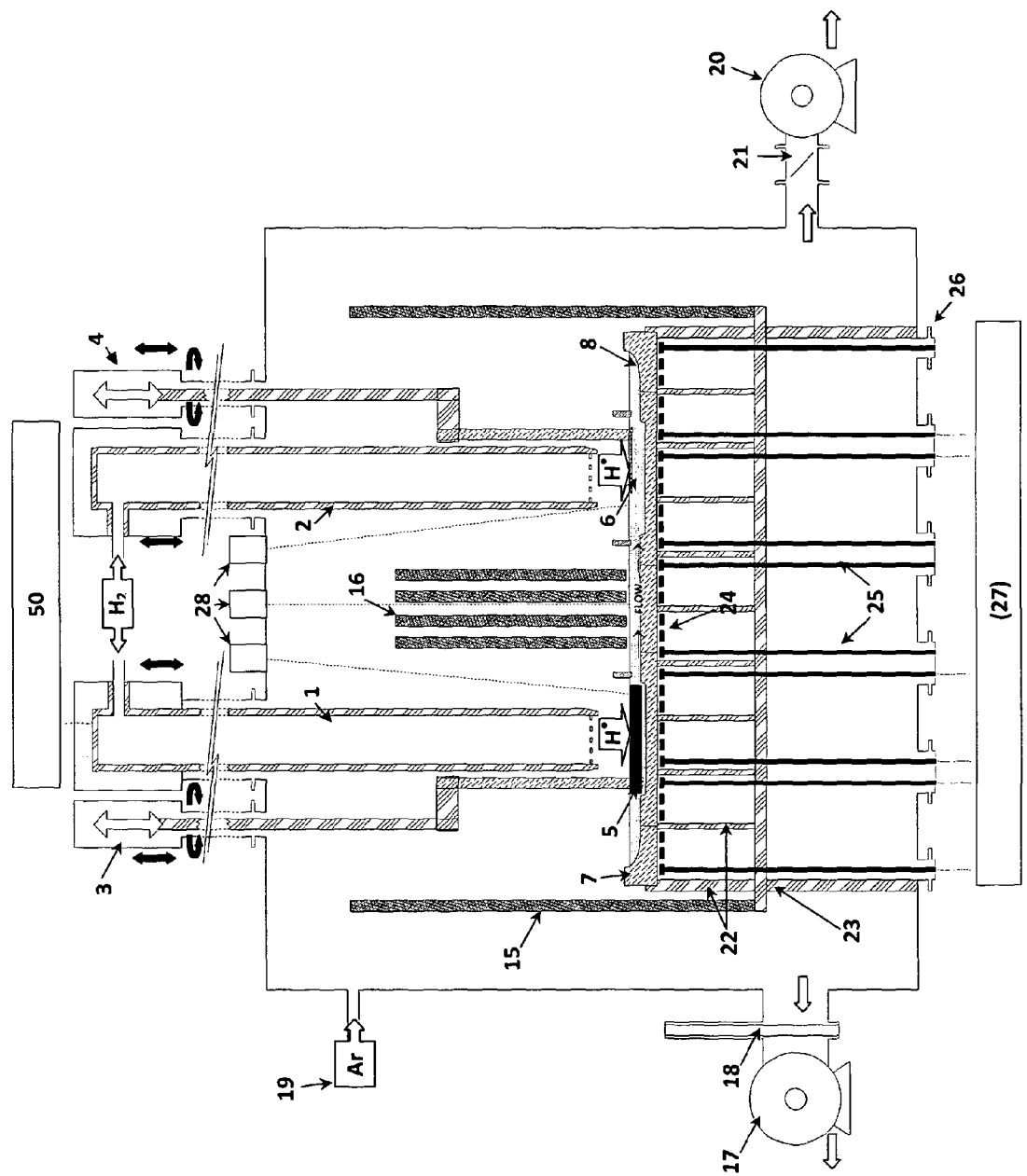

FIG. 2: An embodiment of the invention showing a vertical cross section of the apparatus during the diamond growth stage. The vertical cross sectional plane cuts through the dissolution and deposition zones (10) and (13) and therefore illustrates the direction of solvent flow across these two key sections. A power supply is indicated by the reference number (50).

Figure 3:
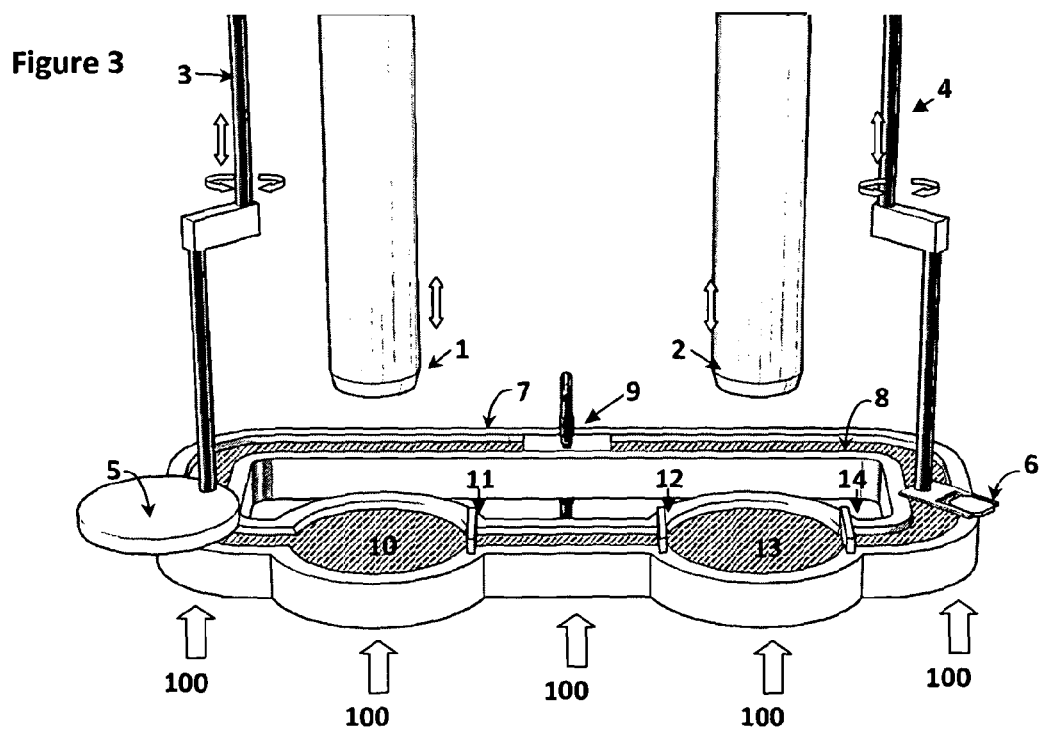

FIG. 3: An embodiment of the invention showing the key internal parts of the process apparatus during the first stage of operation where the solvent medium is melted. The surrounding vacuum chamber, internal heating elements, heat shields and supports are not shown in this projection for the purpose of clarity. At this stage, plasma and/or atomic hydrogen radical generating units (1) and (2) are held in a position away from the trackway (7). The graphite source arm (3) and diamond seed arm (4) are removed from the trackway vertically and rotated out of position behind heat shielding (not shown). Arrows (100) indicated heat.

Figure 4:
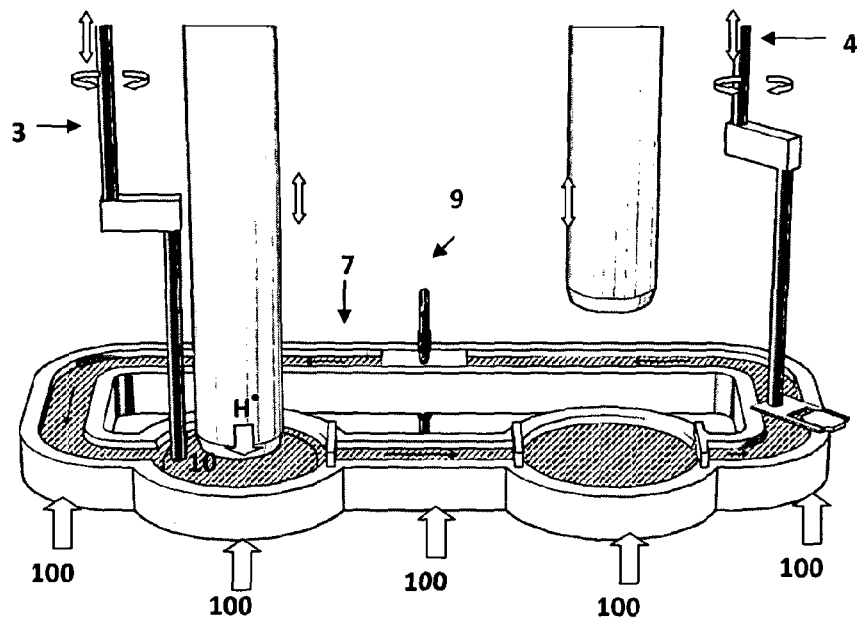

FIG. 4: An embodiment of the invention showing the key internal parts of the process apparatus during the second stage of operation where the graphite source arm (3) has been rotated and lowered so that the graphitic source material (5) is immersed just below the solvent meniscus in the dissolution zone (10). At this point, the plasma and/or atomic hydrogen radical generating unit (1) has also been lowered into place above the dissolution zone and activated in order to provide a source of atomic hydrogen radicals at the surface of the solvent medium. Dissolution of the graphitic source material then proceeds rapidly. At the same time, power is applied to the electromagnetic pump electrodes and coil (9) so that a steady flow of solvent material is initiated around the trackway (7) as indicated. In some embodiments of the invention, this is the stage at which a voltage bias is applied to the graphitic source material in order to enhance the dissolution rate further. Arrows (100) indicated heat.

Figure 5:
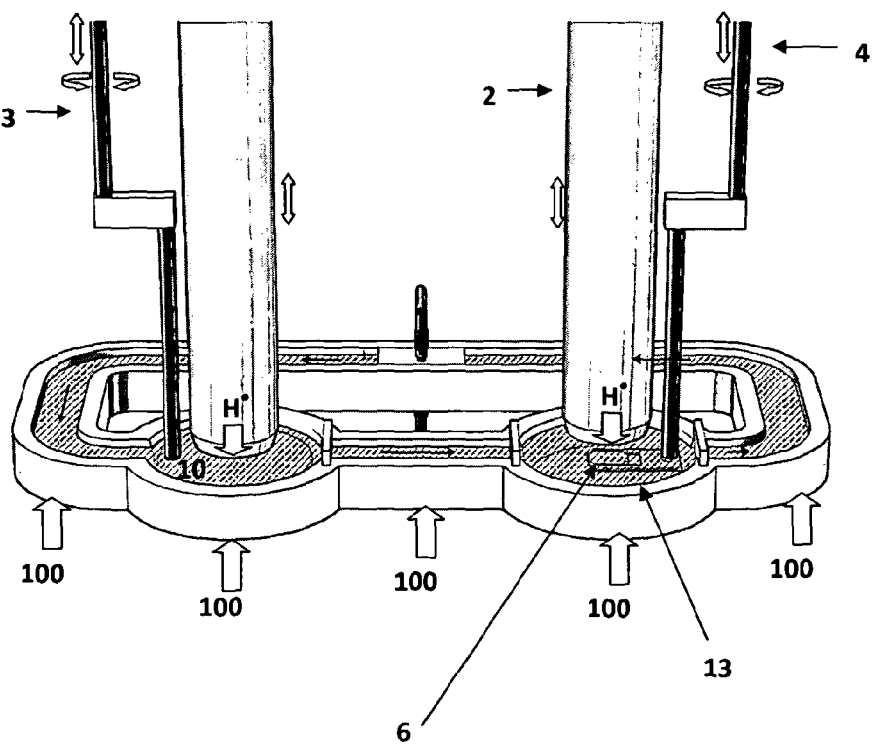

FIG. 5: An embodiment of the invention showing the key internal parts of the process apparatus during the diamond growth stage of operation where the diamond seed arm (4) has been rotated and lowered so that the diamond seed (6) is immersed just below the solvent meniscus in the deposition zone. At this point, the plasma and/or atomic hydrogen radical generating unit (2) has also been lowered into place above the deposition zone and activated in order to provide a source of atomic hydrogen radicals at the surface of the solvent medium. This is done to preferentially degrade any graphitic nuclei forming alongside diamond in the deposition zone. In some embodiments of the invention, a voltage bias is applied to the solvent medium via an electrode integrated into the diamond seed arm (4) in order to enhance the diffusion of hydrogen species into the solvent medium. In another embodiment of the invention, a DC bias applied to the solvent medium via an electrode integrated into the diamond seed arm (4) leads to a DC plasma directly above the solvent medium, increasing the interaction of hydrogen radical species with the solvent surface. Arrows (100) indicated heat.

DETAILED DESCRIPTION OF THE APPARATUS

FIG. 2 shows a cross sectional view of the main body of one embodiment of the process apparatus. FIGS. 3, 4 and 5 give a 3-dimensional perspective view looking onto trackway and show the relative position of the dissolution and deposition zones and associated manipulator arms and plasma and/or atomic hydrogen radical generating sources in a simple embodiment of the apparatus. These diagrams however are only intended as illustrative guides to the invention which in itself may be embodied in a variety of forms. Variations on the form and format of these embodiments and associated instruments and controls would be recognisable to a skilled practitioner of the art.

The process apparatus is enclosed in a vacuum tight chamber of two or more parts, preferably constructed of stainless steel or aluminium. This chamber can be water or air cooled, but is preferably water cooled, either by a double skinned construction or by the presence of a cooling trace pipe wound around the outside of the chamber. On the top of the chamber are several vertical ports, onto which are mounted the plasma and/or atomic hydrogen radical generation units (1) and (2) and the graphite source manipulator arm (3) and diamond seed manipulator arm (4). The two plasma and/or atomic hydrogen radical generation units are mated to the ports via standard linear shift mechanisms (not shown in FIG. 2) with a degree of vertical travel to allow for precise adjustment of the distance of the concentrated area of atomic hydrogen species above the solvent surface (8) and to allow the insertion and removal of the graphite source and diamond seed at the required points during operation. The graphite source manipulator arm and diamond seed manipulator arm are also mated to the chamber ports via linear and rotary shift mechanisms, allowing both parts to be rotated and raised or lowered into the solvent (8) via 2 axes of movement. The available axes of movement of both manipulator arms and linear shift mechanisms are indicated by arrows in FIGS. 2, 3, 4 and 5. At the centre of the enclosed chamber area is a loop structure called a trackway (7) used to contain the molten solvent in a configuration that is open to the ambient environment.

Preferably, this is constructed of a refractory material capable of withstanding high temperatures, such as alumina, zirconia, boron nitride, titanium diboride, magnesia, yttria, molybdenum, tantalum, titanium or other refractory material that is relatively inert to the solvent material used. This can also be constructed of a high temperature refractory material coated with a ceramic film such as alumina coated molybdenum, or boron nitride coated tantalum, or silicon carbide coated graphite. More preferably, the trackway is constructed using boron nitride, alumina or graphite coated with either boron nitride or alumina. The trackway consists of four distinct areas that are illustrated best in FIGS. 3, 4 and 5. These are the dissolution zone (10), the deposition zone (13), the pumping and/or moving area (9) and the basic track areas in between these parts. The trackway can be constructed of either a single piece of material, or in discrete segments that are held tightly in place by the supporting stands (22). The supporting stands (22) are mounted onto a further supporting frame (23). Preferably the supporting stands are constructed from a refractory ceramic or metal. More preferably, the supporting stands are constructed from boron nitride, molybdenum or tantalum. The supporting frame is preferably constructed from a refractory material or metal.

Preferably the supporting frame is constructed from a grade of stainless steel suitable for use at high temperature.

Several heating elements (24) are held just under the trackway structure by free standing electrodes (25) that enter the main chamber via vacuum tight feedthrough ports (26). These heating elements are preferably present under the entirety of the track structure, and are each controlled separately (27) ((27) refers to the heating element power control unit) using methods familiar to a practitioner of the art. In one embodiment of the invention, optical thermocouples mounted on appropriate ports at the top of the chamber (28) are used to determine the temperature at key sections along the meniscus of the solvent. The resulting temperature signal is, via a temperature controller, used to control the power supplied to the heating elements directly underneath each monitored zone, thus allowing for direct temperature control of the zone. This zoned level of control allows different sections of the trackway to be heated to different temperatures according to the requirements of the process. Furthermore this allows the temperatures of the dissolution and deposition zones to be kept substantially different, thereby driving the thermodynamics of the diamond growth process. In one embodiment of the invention, simple resistance heating elements are used, preferably constructed of graphite, coated graphite or carbon-carbon composite. Other methods of supplying and controlling the application of heat to the trackway and solvent medium can also be used, such as induction heating, heating by photonic means, or indirect heating from a plasma source.

Heat shielding is used extensively within the apparatus. The main outer heat shields (15) are used to shield the inner chamber walls and peripheral ports from the heat generated by the heating elements and plasma source and/or atomic hydrogen radical generators. Within the trackway, vertically mounted heat shields (16) are used to shield the dissolution area from the deposition area in order to maintain the lower temperatures required in the deposition area. Heat shielding between the front and rear of the trackway is also used in order to protect the pumping and/or moving area (9) from direct exposure to the heating elements where possible. Several ports on the system are present that allow for the admission of gases and the connection of vacuum generating equipment and associated valves. A port for the controlled inlet of an inert gas, preferably argon (19) is connected to a supply of the pure gas via a metering system, such as a mass flow controller, and control valve. A larger port near the bottom of the chamber is connected to a gate valve (18), which in turn is mounted onto a high vacuum pump (17) in a manner that allows the pump to be isolated from the chamber environment when not required. Preferably this is a turbomolecular pump, or other pump capable of achieving high vacuum conditions of less than $1 \times 10^{-3}$ mbar [$1 \times 10^{-4}$ kPa] in the system. A further port for vacuum pumping via a throttle valve (21) and roughing pump (20) is provided for normal operation at rough vacuum pressures (i.e. >100 Pa).

In the embodiment of the invention illustrated in FIGS. 3, 4, and 5, the pumping and/or moving area (9) of the trackway consists of a DC powered electromagnetic pump. This consists of a normal section of the trackway, with a small section of refractory ceramic or other non conductive refractory material fitted closely into the top to form an enclosed section of track. Integrated into the section are two electrodes, preferably constructed from an inert non wetting metal or carbon form. An electromagnetic coil is mounted on to the enclosed track section, oriented so that the field lines are applied directly down perpendicular to the trackway and the electric field provided by the electrodes. DC voltage is then applied to both the electrodes and electromagnet using a controlled power supply, connected via a feedthrough on the side of the chamber. This can be used to gently propel the solvent around the trackway once molten in the direction indicated. Control of the power supply can then be adjusted to give an optimum flow speed as appropriate.

In another embodiment of the invention not shown, flow around the trackway is governed my mechanical means, such as the use of a rotary paddlewheel sitting in the trough of the trackway and connected to an external motor via a rotary feedthrough. Such a paddlewheel can be constructed in either refractory ceramic, or refractory metal as appropriate.

In one embodiment of the invention illustrated in FIGS. 2-5, the atomic hydrogen plasma at the dissolution and deposition zones is produced by two remote plasma sources (1) and (2) mounted at the top of the chamber. High purity hydrogen gas is fed into the generators in a controlled manner using a leak valve, mass flow controller, or other means familiar to a skilled practitioner of the art. Hydrogen is then dissociated into atomic form within the plasma generation units and directed down onto the surfaces of the solvent in the dissolution and deposition areas. In this embodiment of the invention, the distance between the area where dissociation of hydrogen occurs and the surface of the solvent is kept at a minimum to prevent too much recombination of hydrogen as it travels towards to solvent surface. In other embodiments of the invention, differentially pumped remote plasma sources are used so that the system can operate at ambient pressures above 100 Pa. In another embodiment of the invention, the atomic hydrogen plasma is produced by a magnetron mounted above the chamber, with the hydrogen gas injected above the dissolution and deposition areas from a feedthrough above the chamber. In another embodiment of the invention, atomic hydrogen is produced by arc-jet structures mounted above the dissolution and deposition areas. In a further embodiment of the invention, atomic hydrogen is produced by hot filament assemblies mounted above the dissolution and deposition areas. In all cases, the ignition, density, temperature and other characteristics of the plasma and/or source of atomic hydrogen and other reactive hydrogen species are controlled using methods and instruments that are familiar to a skilled practitioner of the art.

In the embodiment of the invention described by FIGS. 2 to 5, the graphitic source of carbon is in the form of a graphite disc that is attached to the graphite source manipulator arm by a rod or tube structure consisting of a refractory material, preferably constructed of a ceramic that is inert to a wide range of solvent materials, and most preferably constructed of boron nitride or alumina. The graphite source material can be any density or porosity of graphite available commercially, or other form of carbon consisting of mostly $sp^2$ bonded carbon atoms. Preferably the material used has a relatively low porosity, and relatively high density. The purity of graphite used is preferably greater than 99% carbon (in terms of the number of atoms of carbon as a proportion of the total number of atoms), more preferably 99.99% carbon. The purity of the graphite used can be as low as 70% however if the only other significant impurity is hydrogen, but preferably the combination of the two atomic proportions of carbon and hydrogen in the graphitic material is over 99.9% in comparison to other impurities present. In processes where the production of a diamond material with specific isotopic proportions is desired, the graphitic source can be constructed from corresponding proportions of carbon-12, carbon-13, or carbon-14 as required.

The shape of the graphitic source material is designed to expose as large a surface area as possible to the solvent and atomic hydrogen plasma and/or atomic hydrogen radicals above it during dissolution. In this regard, the uppermost surface in the graphitic source shown in FIGS. 2-5 can be smooth, roughened, or machined in order to present a larger surface area to the solvent medium. Furthermore, the graphitic source is designed to have a footprint that enables it to be fully submerged under the solvent meniscus of the dissolution area during the solvation process. The depth to which the graphitic material is submerged under the meniscus is deliberately kept as shallow as possible (illustrated in FIGS. 4 and 5). Preferably this depth is less than 50 mm, more preferably less than 10 mm, and most preferably less than 2 mm. This is to allow diffusion of the hydrogen species generated by the plasma generating unit and/or source of hydrogen radical species (1) onto the surface of the graphitic source material where possible. This is done to ensure that the concentration of carbon in the solvent medium is pushed to a much higher value than the reported equilibrium value determined by standard binary phase diagrams. The effect of atomic hydrogen on the solubility of carbon in liquid metal and alloy media in this manner is well documented in the literature record. Without wishing to be bound by any particular theory, this is thought to be due to the formation of solvent-carbon-hydrogen species within the fluid solvent that display far higher equilibrium concentrations than the simple solvent-carbon binary systems.

In some embodiments of the invention, the graphitic source material is voltage biased in order to enhance the diffusion of charged species from the surrounding atomic hydrogen plasma and/or source of atomic hydrogen into the solvent medium. This is done by the connection of the graphitic source material to a voltage source via an internal electrode incorporated into the manipulator arm. To complete the circuit and provide an electric field across the meniscus and the plasma above it, a further electrode can be placed around the end of the of the plasma generating unit and/or source of atomic hydrogen (1) in a manner that insulates it from the main body of the unit. In another embodiment, the second electrode is a ring structure that is attached to the shaft above the graphitic source plate without obstructing the path from a plasma and/or radical source to the meniscus of the solvent. These electrodes exit the chamber via a standard feedthrough and are connected to an external power supply that is controlled by standard means. When operational, these electrodes can be used to produce a variable charge differential between the graphitic source material, the solvent material, and ultimately the hydrogen plasma above it. This can be either a constant field if using a direct current source, or a variable field if using an alternating current source or a high frequency power supply.

The solvent medium itself can be either a metal, semi-metal, or non-metal in the liquid phase. Preferably the solvent medium comprises a liquid metal. Preferably, the solvent medium forms lower energy interfaces with common diamond surfaces compared to common graphite surfaces. Preferably, the solvent does not react with carbon to form stable carbides. Preferably, the solvent has a melting point that is below 1500° C. Preferably, the solvent has a boiling point that is in excess of 600° C. Preferably, the solvent is chemically stable at room temperature and pressure, and does not react appreciably with any parts of the trackway when molten. Preferably, the solvent is an elemental metal or alloy of two or more elemental metals. Preferably the solvent used is composed primarily of tin, indium, gallium, lead, antimony, germanium, bismuth, nickel, cobalt, iron, lanthanum, gold, silver, copper, palladium, or aluminium.

The solvent medium can also be composed of two immiscible fluids, such as aluminium and lead, or aluminium and bismuth. In this way, it is possible to nucleate and grow diamond in the deposition zone at the interface between the two fluid layers if one of the fluids is less dense than diamond. This can be used to produce a diamond form that grows along the interface between the two fluids, enabling the production of diamond sheet layers. In some embodiments of the invention, small "dams" made of a refractory material, preferably a high temperature ceramic, are present at the exit of the dissolution zone (11), the entrance to the deposition zone (12) and at the exit of the deposition zone (14). These dams protrude just below the meniscus layer and thus isolate any material formed on the solvent meniscus from leaving either the deposition zone or dissolution zone. At the dissolution zone, this is done to prevent any graphitic fragments formed during dissolution of the graphitic source material from leaving the dissolution zone. At the deposition zone, the dams prevent any diamond particles that form from leaving the deposition area. In one embodiment of the invention, the dams either side of the deposition zone are also used to hold in a thin layer of immiscible fluid above the main body of solvent fluid, such as a layer of aluminium held above a main solvent layer of lead. In this manner, the layer of aluminium is continuously saturated with carbon dissolved in the lead below, eventually forcing the precipitation of carbon at the interface between the two fluids. Due to the preventative effects of the atomic hydrogen species on graphitic nucleation, diamond again forms at the interface. If a diamond seed crystal is present at the interface, carbon in the two saturated fluids will grow onto the existing diamond surface as diamond.

Diamond can be grown in the deposition zone by either by direct nucleation from the solvent itself and then subsequent further growth, or by direct overgrowth onto a diamond seed crystal. In both cases, the solvent medium can be either electrically neutral with respect to the atomic hydrogen plasma, or electrically biased using a similar technique as for the graphitic source material. In this embodiment of the invention, the diamond manipulator arm is a hollow tube with an electrode running through it that is in contact with the solvent medium directly below the diamond. A second ring electrode is either attached to the outside of a plasma source and/or source of atomic hydrogen via insulated fittings, or attached further up the diamond manipulator arm. These electrodes can be used to produce a variable charge differential between the diamond seed crystal and/or the solvent material and an atomic hydrogen plasma above it. This can be either a constant electrical field if using a direct current source, or a variable field if using an alternating current source or high frequency power supply. In another embodiment of the invention, doped diamond can be grown by the addition of a gaseous precursor to the hydrogen plasma generating source and/or source of atomic hydrogen radicals. Examples of such a gas include, but are not limited to, nitrogen, borane, hydrogen sulphide, or phosphine in order to dope the growing diamond crystal with nitrogen, boron, sulphur, or phosphorus atoms respectively.

An embodiment of the invention shown in FIGS. 2 to 5 shows a diamond seed manipulator assembly (4) with a thin diamond seed crystal at the bottom (6) held by a pincer or clamp shaped structure. Preferably this structure and the connecting rod structure leading to it is made from a refractory material, preferably made from a ceramic material, and more preferably made from boron nitride or high temperature alumina, zirconia or other ceramic resistant to high temperature. In this embodiment of the invention, the diamond seed crystal is shown withdrawn from the deposition area in FIGS. 3 and 4, and then immersed just under the solvent meniscus in FIG. 5. The depth to which the seed crystal is submerged under the meniscus is deliberately kept as shallow as possible. Preferably this depth is less than 50 mm, more preferably less than 10 mm, and most preferably less than 2 mm. This is to allow diffusion of the atomic hydrogen species generated by the plasma generating unit and/or atomic hydrogen radical source (2) into the solvent medium surrounding the diamond. This background concentration of atomic hydrogen radicals preferentially degrades any graphitic nuclei that may precipitate out alongside diamond in the heavily supersaturated environment of the deposition area. This in turn encourages carbon dissolved in the solvent medium to precipitate out as diamond onto the seed diamond surface, thus increasing its mass. In embodiments of the invention that grow diamond onto a seed diamond crystal, the diamond generally is not immersed into the solvent medium until the dissolution process has been running for several minutes and the solvent is therefore fully supersaturated with dissolved solvent-carbon-hydrogen species. This is done to prevent dissolution of the diamond seed in the solvent, which can occur rapidly if the solvent is not supersaturated with carbon with respect to diamond. In an embodiment of the invention using two immiscible solvents in the deposition area (described above), the diamond is also not immersed into the deposition zone until both solvent layers are supersaturated with carbon.

In one embodiment of the invention, diamond is nucleated directly in the deposition zone without the need for a seed diamond crystal. This is done by driving the temperature gradient between the dissolution and deposition zones to a point at which the free energy required to nucleate a critical cluster of diamond, ($\Delta G^*_D$ in FIG. 1) is low enough to encourage the precipitation of diamond in preference to graphite. In extreme cases of temperature gradient highlighted in FIG. 1, the free energy requirements to form a diamond cluster of critical size will be lower than those of graphite, and therefore only diamond will form. However, in this embodiment of the invention, graphitic clusters of critical size may still form alongside diamond. These will however be removed by the preferential degradation of the clusters by the atomic hydrogen.

In embodiments of the invention where diamond is nucleated directly and allowed to float to the solvent surface, it is possible to then grow these diamond nuclei into a continuous film, using the carbon dissolved in the solvent as a source for this nucleation and growth. Using a solvent with a lower density than diamond allows for growth of diamond along the bottom of the deposition area, at which point it can be grown into a thick film or a free standing polycrystalline mass. In this manner solid items immersed into a solvent with lower density than diamond, or solid items held at the interface of such a solvent with another solvent with a higher density than diamond, can be coated with a continuous diamond film or polycrystalline mass. Such items include but are not limited to drill bits, carbide tooling inserts and blanks, parts for use in high wear applications, or negative mould blanks designed to be separable from the grown diamond film.

In all embodiments of the invention, a high average temperature of the solvent material is preferred in order to maximise the kinetics of both the dissolution of the graphite and the growth of diamond. Generally, the temperature of the dissolution zone is above 500° C., but preferably above 1000° C. and more preferably above 1250° C. The temperature of the deposition zone as measured by the optical thermocouple sensors (28) is generally 50° C. below the temperature of the dissolution zone. Preferably the temperature difference is 100° C., but more preferably 150° C. below temperature of the dissolution zone. This is to ensure that the solvent is heavily supersaturated with carbon when it reaches the cooler deposition zone. Generally the temperature of the rest of the trackway area is kept at the same temperature as the deposition zone.

The present invention will be further illustrated with reference to the following non-limiting Example.

EXAMPLE 1

Prior to operation of the diamond synthesis process, the chamber is prepared for use by loading a graphite source disc onto the end of the manipulator arm (3) and inserting a diamond seed crystal onto the end of the manipulator arm (4). The solvent material is then loaded into the trackway, and the removable sections of the pump (9) fixed in place. The chamber lid is then sealed, and the roughing vacuum pump (20) activated and valve (21) opened. The chamber is then pumped down to 0.1 mbar [0.01 kPa] pressure, the valve (21) closed, and then filled with pure argon via port (19) to 600 mbar [60 kPa] pressure. The chamber is then pumped down to 0.1 mbar [10 Pa] pressure again and refilled with argon three times in order to remove any traces of oxygen in the internal atmosphere. Control circuits then activate the heating elements below the trackway, slowly raising the average temperature of the trackway to 400 C. The system is then left to outgas at this temperature for at least 1 hour, with the pressure kept at below 0.1 mbar [10 Pa] by the roughing vacuum pump. The high vacuum pump (17) is then started, the valve (21) is closed and the gate valve (18) is opened. The high vacuum pump then is left operational until the chamber pressure is reduced to 0.00005 mbar [0.005 Pa] or below. The gate valve (18) is then shut, and argon bled back into the system until the pressure reaches approximately 1 mbar [100 Pa]. At this point, the valve (21) is then reopened and used to throttle the roughing pump, effectively maintaining a steady pressure of around 1 mbar [100 Pa] in the chamber.

The configuration of the graphitic source manipulator arm (3), diamond seed manipulator arm (2) and plasma generating units (1 & 2) at this stage are removed from the proximity of the trackway as illustrated in FIG. 3.

The temperature of the heating elements is then slowly ramped to full operational temperature over a number of hours. In an example of the process using indium as the solvent material, the temperature for all elements is set to 1450° C. At this point, the solvent pump system is started, and the start of flow is checked visually via viewports in the front and top of the chamber (not shown). The solvent flow is then adjusted using a control system so that the solvent flow is just about perceptible by a quick visual check. The graphitic source manipulator arm is then rotated so that the graphitic source material (5) is directly above the dissolution zone. It is then lowered gently into the solvent medium to a depth of 1 mm below the solvent meniscus. It is then left for over 10 minutes so that the solvent becomes saturated with carbon. The plasma generating unit (1) is then lowered into place over the meniscus of the dissolution zone as shown in FIG. 4. The hydrogen gas feed to the plasma generating unit is then activated at a set flow rate, and the plasma ignited. The distance of the plasma generating unit above the meniscus is then fine adjusted to ensure an even spread of the plasma over the solvent meniscus. A thin flowing layer of solvent passes over the graphitic source material directly underneath the hydrogen plasma, dissolving the graphite to form a highly supersaturated solvent-carbon-hydrogen solution that then flows gently out of the dissolution zone. The system is then left like this for 10 more minutes for the solvent to become fully mixed.

In this example of the process, the diamond seed manipulator arm (4) is now revolved so that the seed diamond (6) is directly above the deposition zone. The diamond seed is then gently lowered until it is submerged to a depth of 1 mm under the solvent meniscus. The plasma generating unit (2) is lowered into place and the plasma ignited. The position of the plasma generating unit is then fine adjusted so that the plasma is spread above the meniscus of the deposition zone. At this point, the configuration of the system is represented by the diagram in FIG. 5. The temperature gradient between the dissolution zone, deposition zone and trackway is now established by lowering the temperature control setting for the heating elements underneath the deposition zone and trackway.

In this example of the process in operation, the temperature of the dissolution zone is raised to 1550° C., with the deposition zone lowered to 1350° C., and the rest of the trackway temperature lowered to 1250° C. As the temperature at the deposition zone cools and the temperature gradient is set up, diamond now begins to grow continuously on the surface of the seed crystal. In other examples of the process where the temperature gradient between the dissolution zone and the deposition zone is more extreme, this is the point in the process at which diamond clusters begin to nucleate out of the solution in the deposition zone. The extent and rate of diamond growth in the deposition zone can thereby be controlled and fine tuned by adjustment of the temperature gradient, flow rate of the solvent, and intensity of the surrounding hydrogen plasma. For embodiments of the invention that use an electrical bias to enhance the rate of hydrogen diffusion into the solvent, the voltage or frequency of the electric field can also be adjusted in order to control the nucleation and/or growth rate of diamond.

Once growth of the diamond form is completed as desired, the plasma generating units are shut off and moved away from the dissolution and deposition zones. The heating elements are slowly ramped down to a temperature just above the melting point of the solvent material. Power to the solvent pump system is shut off. The graphitic source material and diamond seed are then removed from the solvent and the system left to cool slowly. Finally, the system is pumped down to a pressure of 0.0005 mbar [0.05 Pa] or below using the high vacuum pumping route, and then filled with pure argon up to atmospheric pressure. Once fully cooled, the chamber is opened and the diamond removed for cleaning and weighing.

The invention claimed is:

1. A method of synthesising diamond, the method comprising;
   (i) providing, in the presence of an atomic hydrogen plasma and/or in the presence of atomic hydrogen radicals, in a dissolution zone a liquid metal saturated with carbon with respect to graphite precipitation;
   (ii) transferring at least a portion of the liquid metal from the dissolution zone to a deposition zone;
   (iii) exposing the liquid metal in the deposition zone to atomic hydrogen plasma and/or to atomic hydrogen radicals, the temperature of the liquid metal in the deposition zone being lower than the temperature of the liquid metal in the dissolution zone such that the liquid metal in the deposition zone is saturated or supersaturated with carbon with respect to diamond precipitation;
   (iv) precipitating carbon from the liquid metal in the deposition zone to synthesise diamond; and
   (v) optionally removing the synthesised diamond from the metal.

2. The method according to claim 1 wherein a seed diamond is at least partially immersed in the liquid metal in the deposition zone such that in step (iv) the carbon is precipitated onto the seed diamond.

3. The method according to any of the preceding claims wherein the at least a portion of the liquid metal is transferred from the dissolution zone to the deposition zone by pumping.

4. The method according to claim 1 wherein the dissolution zone and the deposition zone are in fluid communication with one another by means of a continuous loop.

5. The method of claim 4 wherein the loop is an open-sided vessel.

6. The method according to claim 1 wherein the metal comprises a single metallic element, an alloy, and/or two or more metallic elements.

7. The method according to claim 1 wherein the metal comprises lead, bismuth, tin, gold, silver, copper, palladium, indium, gallium, antimony, nickel, cobalt, iron, aluminium, germanium or mixtures of two or more thereof.

8. The method according to claim 1 wherein the method is carried out in a reaction chamber comprising an inert gas.

9. The method of claim 8, wherein the inert gas is argon.

10. The method according to claim 1 wherein the liquid metal in the dissolution zone is at a temperature in the range of from 1000 to 2000° C.

11. The method according to claim 1 wherein the liquid metal in the deposition zone is at a temperature in the range of from 800 to 2000° C.

12. The method according to claim 1 wherein the temperature of the liquid metal in the deposition zone is at least 50° C. less than the temperature of the liquid metal in the dissolution zone.

13. The method according to claim 1 wherein the method is carried out at a pressure in the range of from 1 Pa to 150 kPa.

14. The method according to claim 1 wherein the source of carbon in the metal is graphite.

15. The method according to claim 1 wherein a dopant is included in the liquid metal.

16. The method according to claim 15 wherein the dopant is selected from boron, sulphur, phosphorus, lithium, aluminium and mixtures of two or more thereof.

17. The method according to claim 1 further comprising applying an electrical bias across the liquid metal in the deposition zone and/or dissolution zone.

\* \* \* \* \*